United States Patent [19]

Hawrylo

[11] 4,203,785
[45] May 20, 1980

[54] METHOD OF EPITAXIALLY DEPOSITING CADMIUM SULFIDE

[75] Inventor: Frank Z. Hawrylo, Trenton, N.J.

[73] Assignee: RCA Corporation, New York, N.Y.

[21] Appl. No.: 965,239

[22] Filed: Nov. 30, 1978

[51] Int. Cl.² .................................................. H01L 21/208
[52] U.S. Cl. ...................................... 148/171; 148/172; 148/1.5; 427/87; 29/572; 136/89 CD
[58] Field of Search .................... 148/171, 172, 1.5; 427/87; 29/572; 136/89 CD

[56] References Cited

U.S. PATENT DOCUMENTS

| | | | |
|---|---|---|---|
| 2,820,841 | 1/1958 | Carlson et al. | 136/89 CD |
| 2,844,640 | 7/1958 | Reynolds | 136/89 CD |
| 3,051,839 | 8/1962 | Carlson et al. | 136/89 CD |
| 3,565,702 | 2/1971 | Nelson | 148/171 |
| 3,578,507 | 5/1971 | Chiang et al. | 148/1.5 |
| 3,585,071 | 6/1971 | Koelmans | 29/589 X |
| 3,600,236 | 8/1971 | Marley, Jr. | 148/1.5 |
| 3,687,743 | 8/1972 | LeDuc | 148/171 |
| 3,913,212 | 10/1975 | Bachmann et al. | 148/171 X |
| 3,922,553 | 11/1975 | Bachmann et al. | 148/171 X |
| 3,988,172 | 10/1976 | Bachmann et al. | 148/1.5 |
| 4,074,305 | 2/1978 | Johnston et al. | 357/67 |
| 4,113,531 | 9/1978 | Zanio et al. | 148/174 |
| 4,143,235 | 3/1979 | Duisman | 136/89 CD |

*Primary Examiner*—G. Ozaki
*Attorney, Agent, or Firm*—H. Christoffersen; D. S. Cohen

[57] ABSTRACT

A single crystal layer of either cadmium sulfide or an alloy of cadmium sulfide and indium phosphide is epitaxially deposited on a substrate of cadmium sulfide by liquid phase epitaxy using indium as the solvent.

10 Claims, No Drawings

METHOD OF EPITAXIALLY DEPOSITING CADMIUM SULFIDE

The Government has rights in this invention pursuant to Contract Number NAS1-14349 awarded by NASA, the National Aeronautics and Space Administration.

BACKGROUND OF THE INVENTION

The present invention relates to a method of epitaxially depositing a layer which includes cadmium sulfide, and particularly to such a method which uses liquid phase epitaxy.

Cadmium sulfide, either alone or alloyed with certain other materials, is a semiconductor material which has been used for making piezoelectric devices, solar cells, radiation detectors and the like. Cadmium sulfide is also a direct bandgap material having a bandgap of 2.4 Ev and therefore has possibilities for use in light emitting semiconductor diodes. However, cadmium sulfide has a melting point of about 1750° C. and its elements are highly volatile. Therefore, fabrication of this material requires highly sophisticated equipment and skills. To permit greater ease of making devices which include cadmium sulfide, it would be desirable to be able to simply and easily deposit layers of this material on a substrate.

SUMMARY OF THE INVENTION

A single crystal layer which includes cadmium sulfide is epitaxially deposited on a substrate by placing the surface of the substrate into contact with a solution which includes cadmium sulfide dissolved in indium and cooling the solution to precipitate out the cadmium sulfide which deposits as a layer on the substrate.

DETAILED DESCRIPTION OF THE INVENTION

The method of the present invention includes placing in a furnace boat a mixture of cadmium sulfide and indium. If the layer to be deposited is an alloy of cadmium sulfide and indium phosphide, indium phosphide is also included in the furnace boat.

The furnace boat may be of any well known structure used for liquid phase epitaxy, such as a tilt boat of the structure shown in the article of H. Nelson, "EPITAXIAL GROWTH FROM THE LIQUID STATE AND ITS APPLICATION TO THE FABRICATION OF TUNNEL AND LASER DIODES", RCA Review, No. 24, page 603, 1963, or a slide boat of the structure shown in U.S. Pat. No. 3,565,702 of H. Nelson entitled, "DEPOSITING SUCCESSIVE EPITAXIAL SEMICONDUCTIVE LAYERS FROM THE LIQUID PHASE" issued Feb. 23, 1971. The furnace boat is generally of a refractory material such as graphite.

A substrate of cadmium sulfide is also placed in the furnace boat. In a tilt boat the substrate is placed in the same well as the mixture but spaced from the mixture. In a slide boat the substrate is placed in a recess in the slide with the mixture being in a well in the boat. The cadmium sulfide substrate is of N type conductivity and has its basal plane oriented perpendicularly to the C-axis. The surface of the cadmium sulfide substrate on which the epitaxial layer is to be deposited and which is positioned in the furnace boat so as to be exposed, is the sulphur rich surface, designated B surface.

The furnace boat and its contents are placed in a furnace tube. While maintaining a flow of either a reducing gas, such as hydrogen, or an inert gas, such as argon through the furnace tube, the furnace tube is heated to a temperature at which the indium melts and the cadmium sulfide and indium phosphide, is used, dissolve in the indium. This is about 600° C. to 650° C. The furnace tube is held at this temperature long enough, 10 minutes to one hour, to insure complete melting and homogenization of the solution.

The furnace is then cooled at a rate of 3° to 6° C./minute and after the solution is cooled about 10–20 degrees, the substrate is then brought into conatct with the molten solution. With a tilt boat, the furnace boat is heated while maintained in a tilted position with the mixture being at the lower end of the boat and the substrate being held at the upper end. After the solution is formed the boat is then tilted in the reverse direction to flood the exposed surface of the substrate with the molten solution. With a slide boat, the substrate is brought into contact with the solution by moving the slide until the substrate enters the well containing the solution so that the exposed surface of the substrate is brought into contact with the solution. The furnace boat and its contents are then further cooled. Cooling the solution causes some of the cadmium sulfide or the alloy of cadmium sulfide and indium phosphide to precipitate out of the solution and deposit as an epitaxial layer on the surface of the substrate.

After an epitaxial layer of the desired thickness is deposited, the substrate is removed from the solution. With a tilt boat this is achieved by tilting the boat back to its original position. With a slide boat, the slide is moved to remove the substrate from the well which contains the solution. The substrate with the epitaxial layer thereon, can then be removed from the furnace boat.

EXAMPLE 1

Using a slide furnace boat of the structure shown in U.S. Pat. No. 3,565,702, a mixture of 3 grams of indium and 60 mgs of cadmium sulfide was placed in a well of the furnace boat. A cadmium sulfide substrate, oriented with the [0001] basal plane perpendicular to the C axis, was placed in the recess in the slide of the furnace boat with the sulfur rich surface of the substrate facing upwardly. The furnace boat and its contents were placed in a furnace tube and heated to a temperature of about 650° C. After the mixture in the furnace boat became molten, the temperature was reduced to 630° C. and the slide was moved to carry the substrate into the well containing the molten solution. The furnace was then further cooled at a rate of about 5° C./minute causing some of the cadmium sulfide in the solution to precipitate out and deposit on the surface of the substrate. The slide was then moved to carry the substrate with the cadmium sulfide layer thereon out of the well containing the solution. The substrate was removed from the furnace boat and residual indium left on the surface of the cadmium sulfide layer was removed by etching in sulfuric acid at room temperature. The composition and single crystal structure of the epitaxial layer was verified by x-ray diffractometry.

EXAMPLE 2

Using a slide furnace boat, a mixture of 2 grams of indium, 1 gram of cadmium, 4 mgs of cadmium sulfide, 1 mg of zinc and 3 mgs of indium phosphide were placed in a well of the furnace boat. A cadmium sulfide substrate of the same type as used in Example 1 was placed in the recess in the slide. The furnace boat and its contents were placed in a furnace which was heated to about 650° C. The furnace boat was maintained at this temperature sufficiently to assure that the cadmium sulfide, zinc and indium phosphide completely dissolved in the indium. The temperature was then reduced at a rate of about 5° C./minute and at 610° C., the slide was moved to carry the substrate into the solution. The cooling of the furnace was continued at a rate of 5° C./min. A layer of an alloy of cadmium sulfide and indium phosphide (CdSInP) was deposited on the surface of the substrate. The slide was then moved to carry the substrate out of the solution and the substrate with the layer thereon was removed from the furnace boat. The deposited layer had a red tint or luster to it. The composition and single crystal structure of the epitaxial layer was determined by x-ray diffractometry.

I claim:

1. A method of epitaxially depositing a layer which includes cadmium sulfide on a substrate which method comprises the steps of:
    placing a surface of the substrate into contact with a solution which includes cadmium sulfide dissolved in indium, and
    cooling said solution to precipitate out at least some of the cadmium sulfide which deposits on the substrate.

2. A method in accordance with claim 1 in which the substrate is of cadmium sulfide.

3. A method in accordance with claim 2 in which the layer is deposited on a sulfur rich surface of the substrate.

4. A method in accordance with claim 2 in which the solution consists essentially of cadmium sulfide and indium and the layer deposited consists essentially of cadmium sulfide.

5. A method in accordance with claim 2 in which the solution comprises cadmium sulfide and indium phosphide dissolved in indium and the layer deposited comprises an alloy of cadmium sulfide and indium phosphide.

6. A method of epitaxially depositing a layer which includes cadmium sulfide on a substrate which method comprises the steps of:
    placing in a furnace boat the substrate and a mixture including cadmium sulfide and indium,
    heating said furnace boat to a temperature at which the indium becomes molten and the cadmium sulfide dissolves in the molten indium,
    placing a surface of the substrate into contact with the molten solution, and
    cooling said furnace boat to precipitate out at least some of the cadmium sulfide which deposits on the substrate.

7. A method in accordance with claim 6 in which the substrate is of cadmium sulfide.

8. A method in accordance with claim 7 in which the layer is deposited on a sulfur rich surface of the substrate.

9. A method in accordance with claim 7 in which the mixture placed in the furnace boat consists essentially of cadmium sulfide and indium and the layer deposited consists essentially of cadmium sulfide.

10. A method in accordance with claim 7 in which the mixture placed in the furnace boat comprises cadmium sulfide, indium phosphide, and indium and the layer deposited comprises an alloy of cadmium sulfide and indium phosphide.

* * * * *

UNITED STATES PATENT AND TRADEMARK OFFICE
CERTIFICATE OF CORRECTION

PATENT NO. : 4,203,785

DATED : May 20, 1980

INVENTOR(S) : Frank Zygmunt Hawrylo

It is certified that error appears in the above-identified patent and that said Letters Patent is hereby corrected as shown below:

Column 1, line 62: "basal plane" should be --[0001] basal plane--.

Column 2, line 4: "is" should be --if--.

Signed and Sealed this

Fifth Day of August 1980

[SEAL]

Attest:

SIDNEY A. DIAMOND

*Attesting Officer*     *Commissioner of Patents and Trademarks*